United States Patent [19]

Suh

[11] Patent Number: 5,712,817
[45] Date of Patent: Jan. 27, 1998

[54] HIGHLY INTEGRATED CELL HAVING A READING TRANSISTOR AND A WRITING TRANSISTOR

[75] Inventor: Jung Won Suh, Kyoungkido, Rep. of Korea

[73] Assignee: Hyundai Electronics Industries Co., Ltd., Kyoungkido, Rep. of Korea

[21] Appl. No.: 648,755

[22] Filed: May 16, 1996

[30] Foreign Application Priority Data

May 17, 1995 [KR] Rep. of Korea ............... 1995-12293

[51] Int. Cl.[6] ............................................. G11C 7/00
[52] U.S. Cl. ............................. 365/185.08; 365/185.18
[58] Field of Search ........................ 365/185.08, 185.18, 365/185.25, 185.05; 257/298, 316, 320

[56] References Cited

U.S. PATENT DOCUMENTS

| | | | |
|---|---|---|---|
| 5,357,464 | 10/1994 | Shukuri | 365/185.21 |
| 5,412,599 | 5/1995 | Daniele | 365/185.1 |
| 5,557,566 | 9/1996 | Ochii | 365/185.08 |

Primary Examiner—David C. Nelms
Assistant Examiner—Son Mai
Attorney, Agent, or Firm—Jacobson, Price, Holman & Stern, PLLC

[57] ABSTRACT

The present invention provides a DRAM cell comprising: an input/output bit line; a first word line being activated by a write control signal; a second word line being activated by a read control signal; a first transistor having a first terminal coupled to said input/output bit line, a second terminal, and having a gate electrode coupled to said first word line for coupling said first terminal to said second terminal responsive to said write control signal; and a second transistor having a gate electrode coupled to said second word line, a first terminal coupled to a reference voltage terminal, a second terminal coupled to said input/output bit line, and having a floating gate electrode coupled to said second terminal of said first transistor for coupling said first terminal to said second terminal responsive to said read control signal, wherein the voltage level of said input/output bit line is transferred to said floating gate, and wherein said first transistor varies the threshold voltage of said second transistor at a write operation and is turned off at a read operation, and said second transistor transfers the voltage level of said reference voltage terminal to said input/output bit line at said read operation and is turned off at said write operation.

18 Claims, 11 Drawing Sheets

FIG. 1

Prior Art

HIGHLY INTEGRATED CELL HAVING A READING TRANSISTOR AND A WRITING TRANSISTOR

BACKGROUND OF THE INVENTION

1. Field of the Invention

The present invention relates to a dynamic RAM(random access memory) cell and a method for fabricating the same, and more particularly, to a dynamic RAM cell capable of both decreasing the access time and increasing the operation speed thereof.

2. Description of the Prior Art

Figure 1:
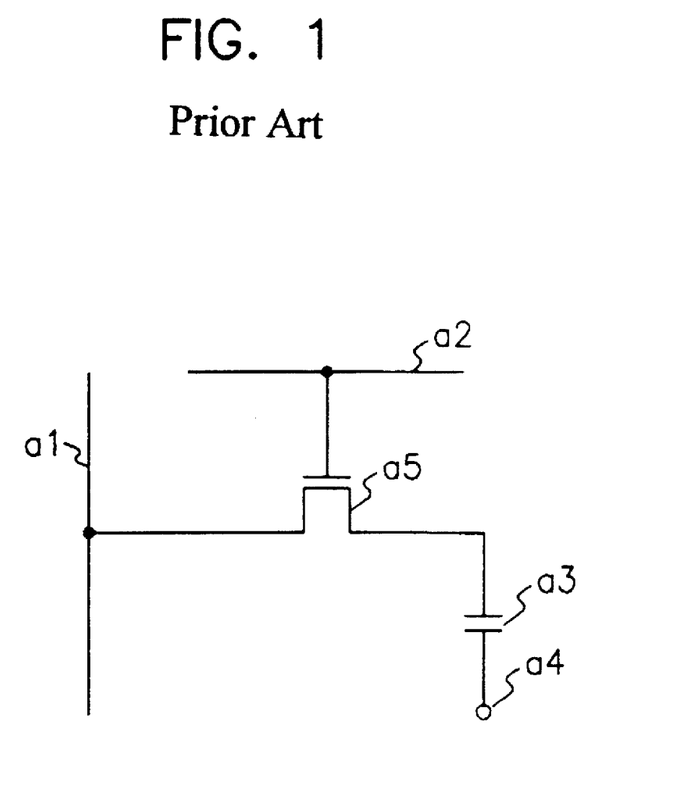
FIG. 1 is a schematic view of a conventional DRAM cell having a transistor and a capacitor.

Generally, a DRAM cell consists of a transistor and a capacitor. FIG. 1 is a schematic view of a conventional DRAM cell. In FIG. 1, the reference numerals a1, a2, a3, a4 and a5 denote a bit line, a word line, a capacitor, a terminal of the capacitor and a MOS transistor, respectively. The word line a2 turns on/off the transistor a5 at the time of reading/writing data stored in the capacitor a3, and the bit line a1 is a data input/output path. Accordingly, this simple DRAM cell is contributed to higher integrated circuits.

However, in very large scale integrated circuits of over 1 giga byte, it is difficult to acquire the desired capacitance is to stably operate the cell because of the applied voltage. Also, the size of the device is scaled, and the increasing cost of complicated processes causes the price of the DRAM to become higher.

Furthermore, the read operation in conventional DRAM cells is executed by the "charge sharing" method in which the changed voltage in a bit line is amplified by a sense amplifier. Therefore, this "charge sharing" method in the read operation is the main cause for the long access time of the DRAM cell in comparison with the SRAM cell.

SUMMARY OF THE INVENTION

It is an object of the present invention to provide DRAM cell capable of decreasing the access time by excluding the "charge sharing" method.

It is another object of the present invention to provide a method for fabricating a DRAM cell having a new structure which is applied to integrated circuits.

In accordance with an aspect of the present invention, there is provided a DRAM cell comprising: an input/output bit line; a first word line being activated by a write control signal; a second word line being activated by a read control signal; a first transistor having a first terminal coupled to said input/output bit line, a second terminal, and having a gate electrode coupled to said first word line for coupling said first terminal to said second terminal responsive to said write control signal; and a second transistor having a gate electrode coupled to said second word line, a first terminal coupled to a reference voltage terminal, a second terminal coupled to said input/output bit line, and having a floating gate electrode coupled to said second terminal of said first transistor for coupling said first terminal to said second terminal responsive to said read control signal, wherein the voltage level of said input/output bit line is transferred to said floating gate, and wherein said first transistor varies the threshold voltage of said second transistor at a write operation and is turned off at a read operation, and said second transistor transfers the voltage level of said reference voltage terminal to said input/output bit line at said read operation and is turned off at said writ operation.

In accordance with another aspect of the present invention, there is provided a DRAM cell comprising: an input/output bit line; a word line which a positive or a negative voltage is applied to; a first transistor having a first terminal coupled to said input/output bit line, a second terminal, and having a common gate electrode coupled to said word line for coupling said first terminal to said second terminal when said positive voltage is applied to said word line; and a second transistor having a first terminal coupled to a reference voltage terminal, a second terminal coupled to said input/output bit line, and having a floating gate electrode coupled to said second terminal of said first transistor for coupling said first terminal to said second terminal when said negative voltage is applied to said word line, wherein the voltage level of said input/output bit line is transferred to said floating gate, wherein said second transistor is turned on by said common gate electrode with said word line, and wherein said first transistor varies the threshold voltage of said second transistor at a write operation and is turned off at a read operation, and said second transistor transfers the voltage level of said reference voltage terminal to said input/output bit line at said read operation and is turned off at said write operation.

In accordance with further aspect of the present invention, there is provided a DRAM cell comprising: an input/output bit line; a word line which a positive or a negative voltage is applied to; a first transistor having a first terminal coupled to said input/output bit line, a second terminal, and having a gate electrode coupled to said word line for coupling said first terminal to said second terminal when said positive voltage is applied to said word line; and a second transistor having a first terminal coupled to a reference voltage terminal, a second terminal coupled to said input/output bit line, and having a gate electrode coupled to said word line and a floating gate electrode coupled to said second terminal of said first transistor for coupling said first terminal to said second terminal when said negative voltage is applied to said word line, wherein the voltage level of said input/output bit line is transferred to said floating gate, and wherein said first transistor varies the threshold voltage of said second transistor at a write operation and is turned off at a read operation, and said second transistor transfers the voltage level of said reference voltage terminal to said input/output bit line at said read operation and is turned off at said write operation.

In accordance with still another aspect of the present invention, there is provided a method for fabricating a DRAM cell comprising the steps of: a) forming a field oxide layer in a silicon substrate; b) forming a MOS transistor having a source region, a drain region, a gate oxide layer and a gate electrode on said silicon substrate; c) forming a first insulating layer on the resulting structure and exposing a portion of said source region; d) forming a first conducting layer on the resulting structure, being electrically connected with said exposed source region; e) removing said first conducting layer which is positioned over said drain region of said MOS transistor; f) forming a second insulating layer and a silicon layer in order on the resulting structure; g) forming highly doped source and drain regions by implanting impurity ions into said silicon layer such that a thin film transistor is formed over said MOS transistor; h) forming third insulation layer on the resulting structure and forming a contact hole exposing said drain region of said MOS transistor, wherein the side wall of said highly doped source of said thin film transistor is exposed in said contact hole; and i) forming a second conducting layer for a bit line, being connected with said drain region of said MOS transistor and said highly doped source of said thin film transistor.

In accordance with yet another aspect of the present invention, there is provided a method for fabricating a DRAM cell comprising the steps of: a) forming, a field oxide layer in a silicon substrate; b) depositing an oxide layer, a first conducting layer, a first insulating layer and a second conducting layer on the resulting structure; c) patterning said second conducting layer, said first insulating layer, said first conducting layer and an oxide layer, in order, exposing a portion of said silicon substrate; d) implanting impurity ions into said exposed silicon substrate to form a MOS transistor which is composed of said oxide layer, said first conducting layer, and source and drain regions; e) forming a second insulating layer on the resulting structure and exposing a portion of said source region; f) forming a third conducting layer on the resulting structure, being electrically connected with said source region; g) removing said third conducting layer which is positioned over said drain region of said MOS transistor; h) forming a third insulating layer and a silicon layer in order on the resulting structure; i) forming highly doped source and drain regions by implanting impurity ions into said silicon layer such that a thin film transistor is formed over said MOS transistor; j) forming a fourth insulation layer on the resulting structure and forming a contact hole exposing said drain region of said MOS transistor, wherein the side wall of said highly doped source of said thin film transistor is exposed in said contact hole; and k) forming a fourth conducting layer for a bit line, being connected with said drain region of said MOS transistor and said highly doped source of said thin film transistor.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, the present invention will be described in detail referring to the accompanying drawings.

A DRAM cell in accordance with an embodiment of the present invention will be described referring to FIGS. 2A and 2B, in which the reference numerals b1, b2, b3, b4, b5, b6, b7, b8 and b9 denote a bit line, a word line for writing data(hereinafter, referred to as a write word line), a word line for reading data(hereinafter, referred to as a read word line), a reference voltage terminal, a floating gate, a transistor for writing data(hereinafter, referred to as a write transistor), a transistor for reading data(hereinafter, referred to as a read transistor), a capacitor and a terminal of the capacitor b8, respectively.

Figure 2A:
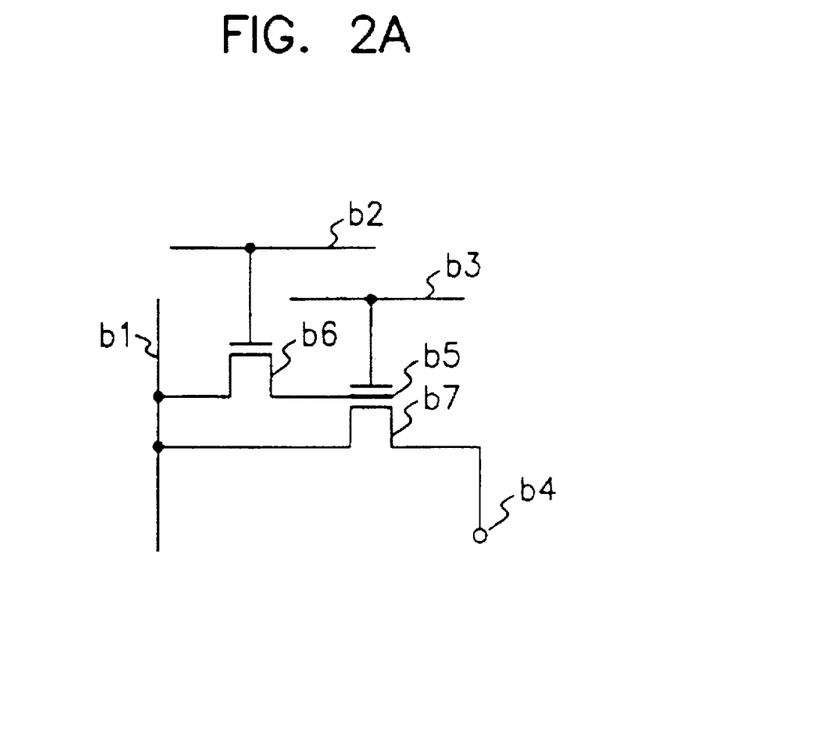
FIGS. 2A and 2B are schematic views of the DRAM cell in accordance with an embodiment of the present invention.

First, as shown in FIG. 2A, a DRAM cell in accordance with the present invention consists of two transistors, one of which is the write transistor b6 and the other of which is the read transistor b7. The write transistor b6 is a MOS transistor and the read transistor b7 has a floating gate b5. The write transistor b6 charges or discharges the floating gate b5 of the read transistor b7, thereby varying the threshold voltage($V_T$) of the read transistor b7. The drain gate and source of the write transistor b6 are coupled to the bit line b1, the write word line b2 and the read transistor b7, respectively, and the drain, gate and source of the read transistor b7 are coupled to the bit line b1, the reed word line b3 and the reference voltage terminal b4, respectively. Furthermore, the floating gate b5 is coupled to the source of the write transistor b6.

1. WRITE OPERATION

When the write word line b2 is activated the time(voltage is applied to the write word line b2), the write transistor b6 is turned on and the floating gate b5, which is coupled to the source of the transistor b6, is charged. After providing charges with the floating gate b5, the write word line b2 is in a non-activated state and the write transistor b6 is turned off, and then, the floating gate b5 is electrically isolated from the bit line b1. Furthermore, because the floating gate b5 is contacted with the silicon substrate on which the source of the write transistor b6 is formed, being isolated from the other elements by the insulating layers, the potential of the floating gate b5 is decreased by the formation of the parasite PN diode formed in the silicon substrate. That is to say, the charges stored in the floating gate be leaks out.

Accordingly, it is necessary to write data into the DRAM cell after a determined period of time, that is, the refresh process is required like the operation of a conventional DRAM cell.

2. READ OPERATION

At the time of reading data stored in the floating gate b5, the read word line b3 is activated.

The threshold voltage ($V_T$) of the read transistor b7 is determined by the amount of charges stored in the floating gate b5. For example, if the threshold voltage ($V_T$) of the read transistor b7 is 3.0V when low data is stored in the floating gate b5, and if the threshold voltage ($V_T$) of the read transistor b7 is 1.0V when high data is stored in the floating gate b5, 2V may be applied to the read word line b3 to turn on the read transistor b7. When the read transistor b7 is turned on, the bit line b1 is electrically connected with the reference voltage terminal b4 and data is read out by transferring charges to the bit line b1. The threshold voltage of the transistor may be effectively varied by storing charges in the floating gate b5 of the read transistor b7. Accordingly, compared with a conventional DRAM cell using the "Charge Sharing" method, the read operation of the DRAM cell in accordance with the present invention can be executed at high speed.

Figure 2B:
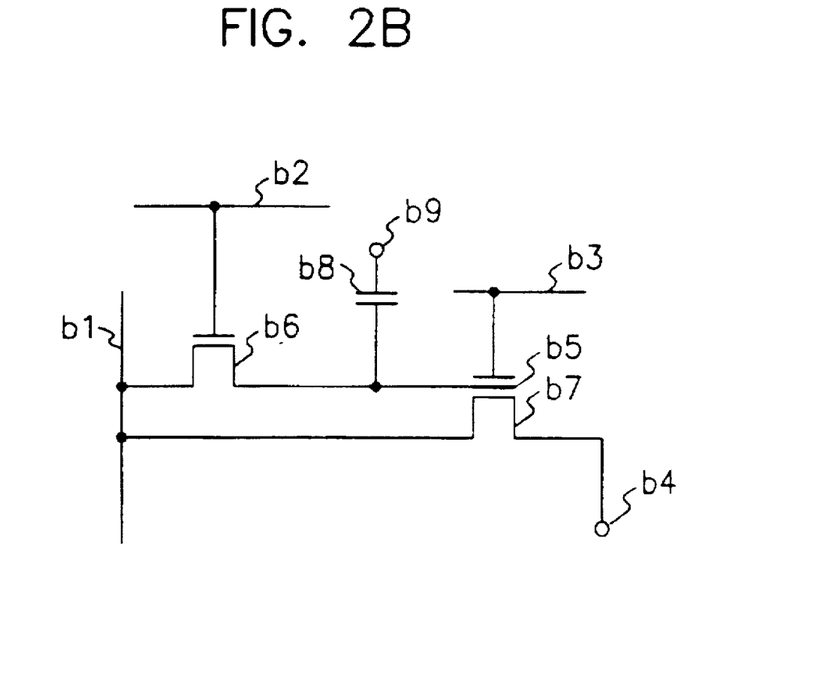

Referring to FIG. 2B, the capacitor b9 is positioned between the write transistor b6 and the floating gate b5, in order to decrease the refresh time within the period of a determine time. The capacitor b9 has the floating gate b5 maintain as many charges as possible.

The DRAM cell in accordance with another embodiment of the present invention will be described referring to FIGS. 3A and 3B.

Figure 3A:
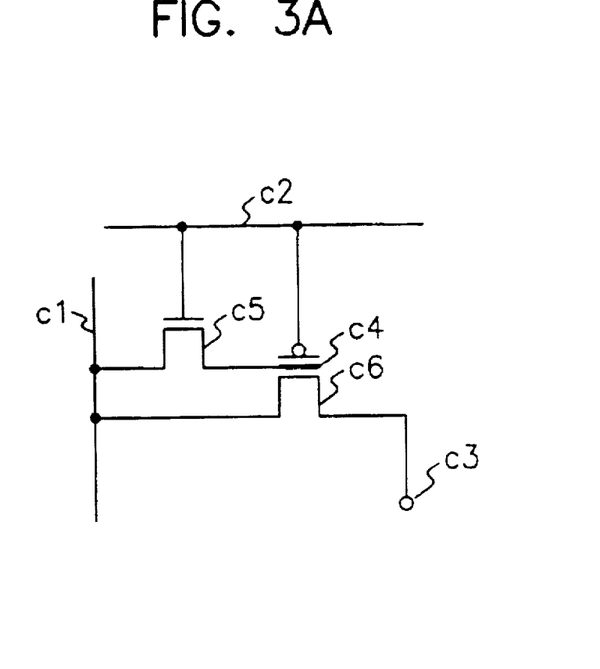
FIGS. 3A and 3B are schematic views of the DRAM cell in accordance with another embodiment of the present invention.
Figure 3B:
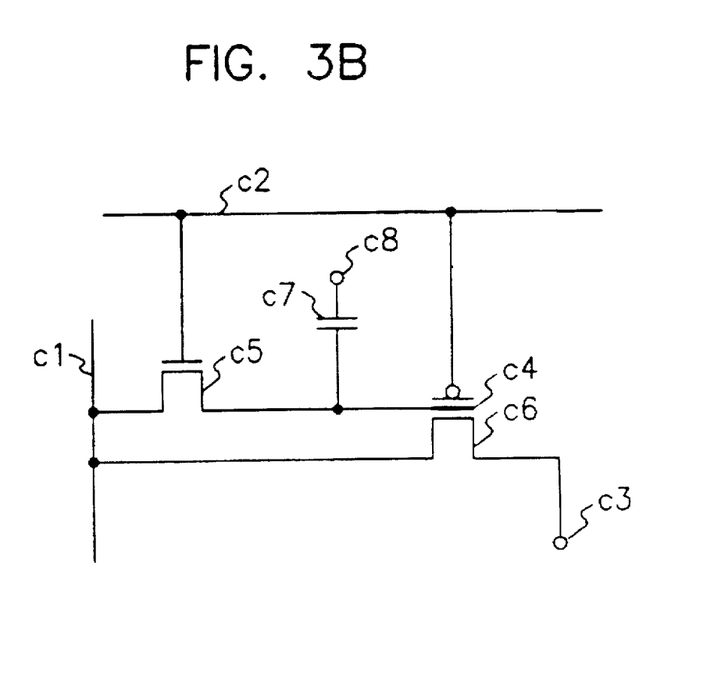

As shown in FIGS. 3A and 3B, another embodiment of the present invention is different from the above embodiment illustrate in 2A and 2B in only the word line c2 and the type of the read transistor c6. Another embodiment of the present invention shows a method capable of implementing a DRAM cell using only the one word line c2. However, as illustrated in FIGS. 3A and 3B, the two transistors c5 and c6 must be respectively turned on at different voltage levels. Accordingly, the write transistor c5 is composed of an NMOS transistor and the read transistor c6 is composed of a PMOS transistor. When a positive voltage is applied to the word line c2, the write transistor c5 is turned on and the read transistor c6 is turned off. Also, when a negative voltage is applied to the word line c2, the write transistor c5 is turned off and the read transistor c6 is turned on. Likewise, the write transistor c5 can be composed of a PMOS transistor and the read transistor c6 can be composed of an NMOS transistor. With respect to the voltage levels applied to the word line c2, table <1> shows the status of the write and read transistors c5 and c6.

TABLE 1

|  | voltage applied to word line | | |
| --- | --- | --- | --- |
|  | −2.5 V | 0 V | 2.5 V |
| write transistor | off | off | on |
| read transistor | on | off | off |

Furthermore, the read transistor c6 can share an electrode as a common gate with the write transistor c5.

As illustrated in FIG. 2B, FIG. 3B is a view illustrating a DRAM cell which further includes the capacitor c8.

Figure 4:
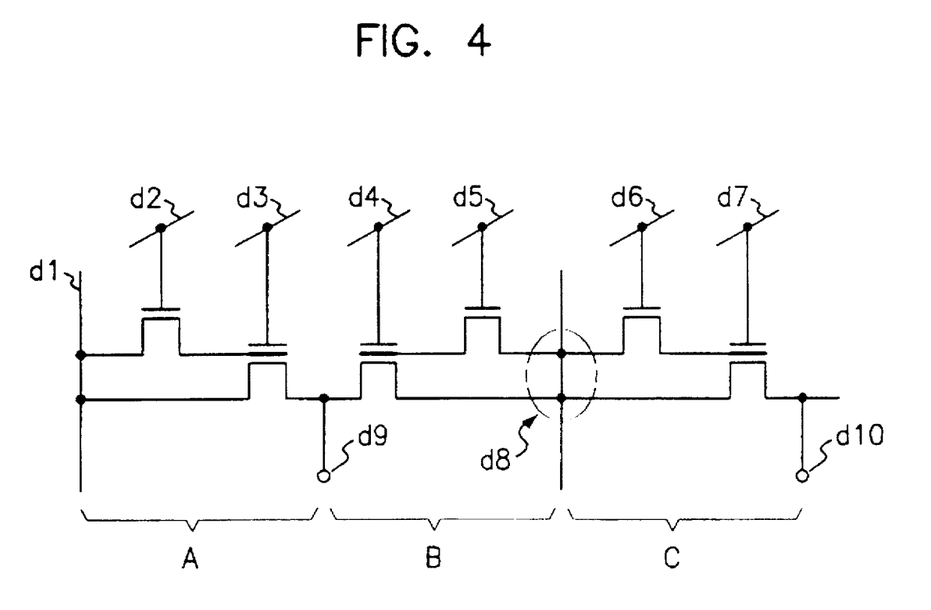
FIG. 4 is a view of the memory cell array of FIG. 2A.
Figure 5:
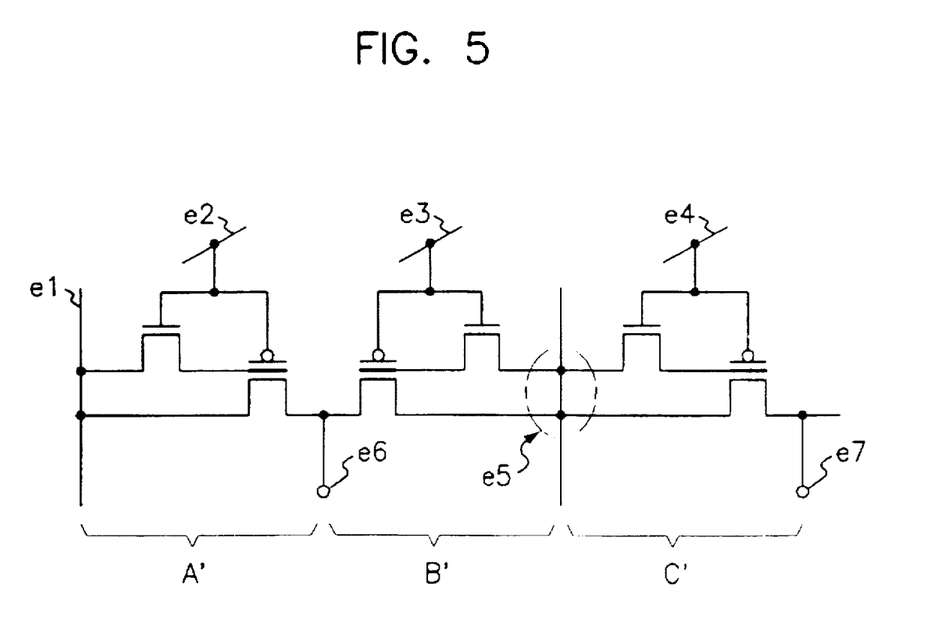
FIG. 5 is a view of the memory cell array of FIG. 3A.

FIGS. 4 and 5 are views showing the DRAM cell array in FIGS. 2A and 3A, respectively. In FIGS. 4 and 5, the reference numerals d1 and e1 denote a bit line, d2, d5 and d6 denote a write word line, d3, d4 and d7 denote a read word line, e2, e3 and e4 denote a read and write word line, d8 and e5 denote a common bit line contact, and d9, d10, e6 and e7 denote a common reference voltage terminal for reading data.

As shown in FIG. 4, in order to decrease the area of the cell array, the DRAM cell A shares the common reference voltage terminal d9 with the neighboring DRAM cell B, and also, the DRAM cell B shares the common bit line contact d8 with the neighboring DRAM cell C.

In the same manner, as shown in FIG. 5, DRAM A', B' and C' have a common reference voltage terminal e6 and a common bit line contact e5 between the neighboring DRAM cells.

Next, a method for fabricating a DRAM cell in accordance with an embodiment of the present invention will be describe in detail, referring to FIGS. 6A to 6F.

Figure 6A:
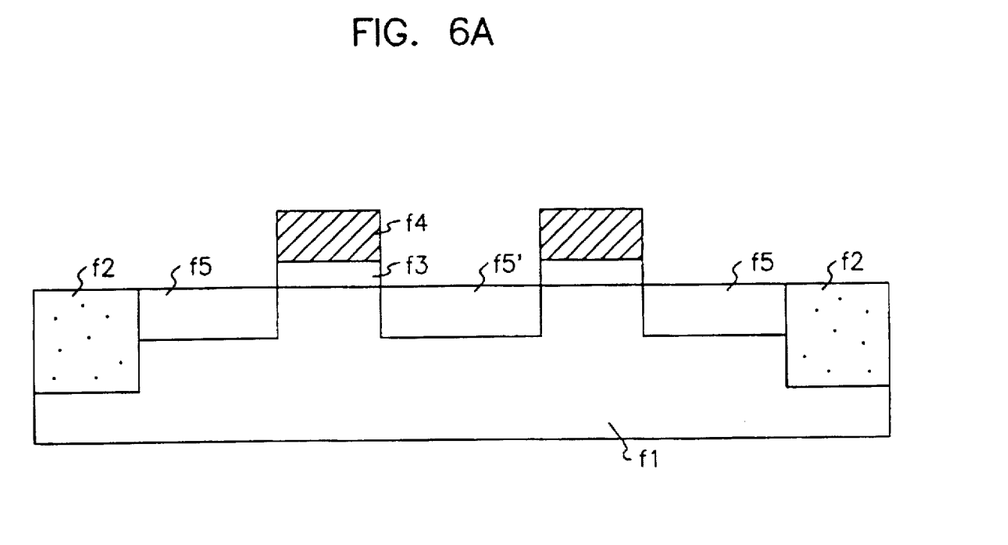
FIGS. 6A to 6F are cross-sectional views illustrating method for fabricating a memory cell shown in FIG. 3A.

First, as shown FIG. 6A a conventional MOS transistor is formed on a silicon substrate f1. That is, after forming a field oxide layer f2, a gate oxide layer f3 and a gate electrode f4 are, in order, formed on the silicon substrate f1 to a determined size, and a source region f5 and a drain region f5' are formed in the silicon substrate f1 by implanting impurity ions into the silicon substrate f1.

Figure 6B:
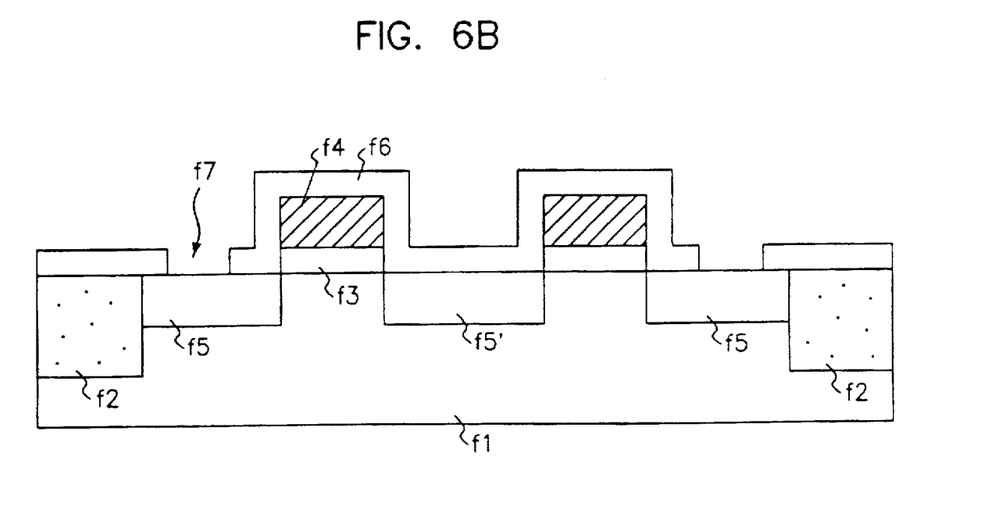

As shown in FIG. 6B, an insulation layer f6 is deposited on the resulting structure and a portion of the source region f5 is exposed by defining the insulation layer f6, in order to electrically connect the source region f5 of the write transistor with a conducting layer which may be used for a floating gate of the present invention.

Figure 6C:
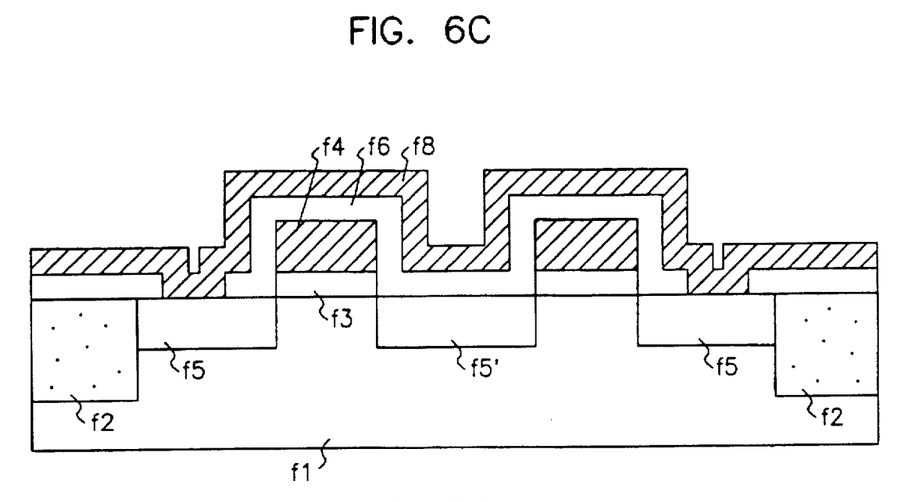

As shown in FIG. 6C, a polysilicon layer f8 for the floating gate is deposited on the resulting structure, being electrically connected with the source region f5.

Figure 6D:
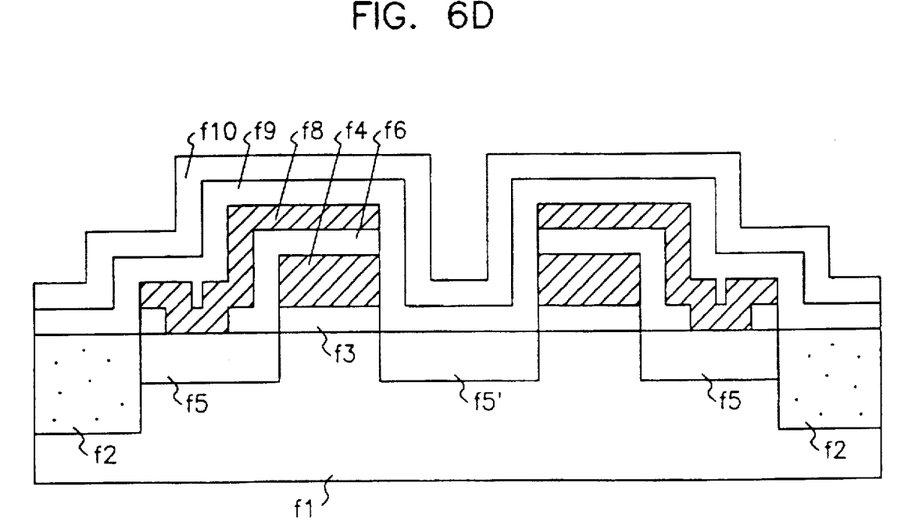

As shown in FIG. 6D, the polysilicon layer f8 is patterned together with the insulation layer f6. At this time, if necessary, the insulation layer f6 may not be patterned. A gate oxide layer f9 of the read transistor and a silicon layer f10 are, in order, deposited on the resulting structure to form a thin film transistor(P-channel).

Figure 6E:
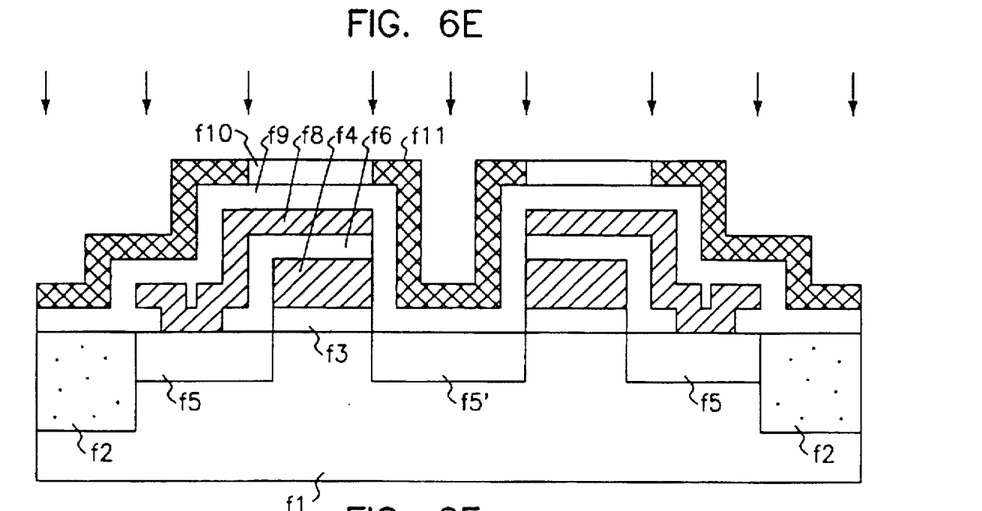

As shown in FIG. 6E, the ion implantation is performed to adjust the threshold voltage of the read transistor by implanting ions into the channel region of the silicon layer f10, and the highly doped source and drain regions f11 are formed by implanting ions into the silicon layer f10 outside the channel region.

Figure 6F:
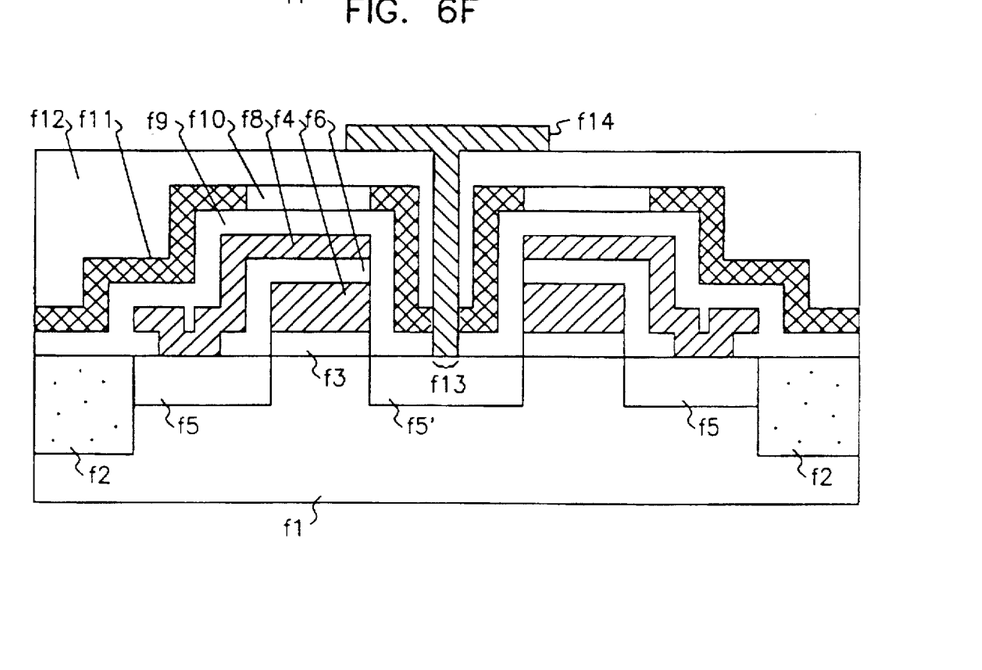

As shown in FIG. 6F, an insulation layer f12 is deposited with the planarization process on the resulting structure, and the portions of the insulation layer f12, the drain region of the read transistor and the insulation layer f6 are etched in order that the drain region f5' is exposed. Accordingly, the sidewall of the drain region f11 of the read transistor and the drain region f5' of the write transistor are exposed in a contact hole f13, and a conducting layer f14 for a bit line is filled in the contact hole f13, being connected with the drains f11 and f5'.

As a result, the DRAM cell in accordance with an embodiment of the present invention is composed of a top gate transistor(write transistor), a bottom gate transistor(read transistor) of which the gate(floating gate) electrode is electrically connected with the source region of the write transistor. Also, the channel region and the floating gate of the read transistor are positioned over the gate electrode of the write transistor. Furthermore, the gate electrode f4 is used as a common gate electrode for the NMOS transistor and the P-channel TFT.

Referring to FIGS. 7A to 7F, a method for fabricating a DRAM cell in accordance with another embodiment of the present invention will be describe in detail.

Figure 7A:
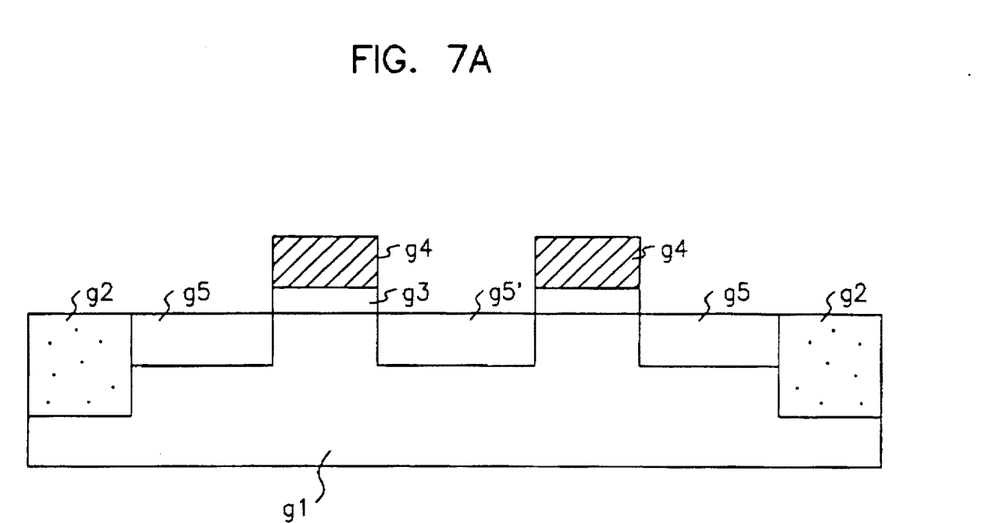
FIGS. 7A to 7F are cross-sectional views illustrating method for fabricating a memory cell shown in FIG. 2A.

First, as shown in FIG. 7A, a conventional MOS transistor is formed on a silicon substrate g1. That is, after a field oxide layer g2, a gate oxide layer g3 and a gate electrode g4 are, in order, formed on the silicon substrate g1 to a predetermines size, and a source region g5 and a drain region g5' are formed in the silicon substrate g1 by implanting impurity ions into the silicon substrate g1.

Figure 7B:
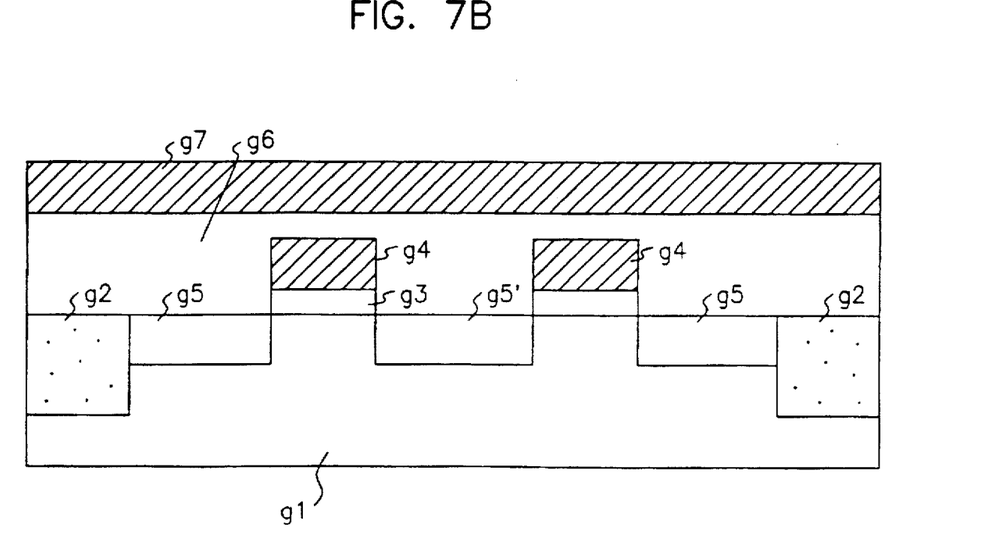

As shown in FIG. 7B, a insulation layer g6 is deposited on the resulting structure with the planarization process and a conducting layer g7 is deposited on the resulting structure to form the gate electrode of the read transistor.

Figure 7C:
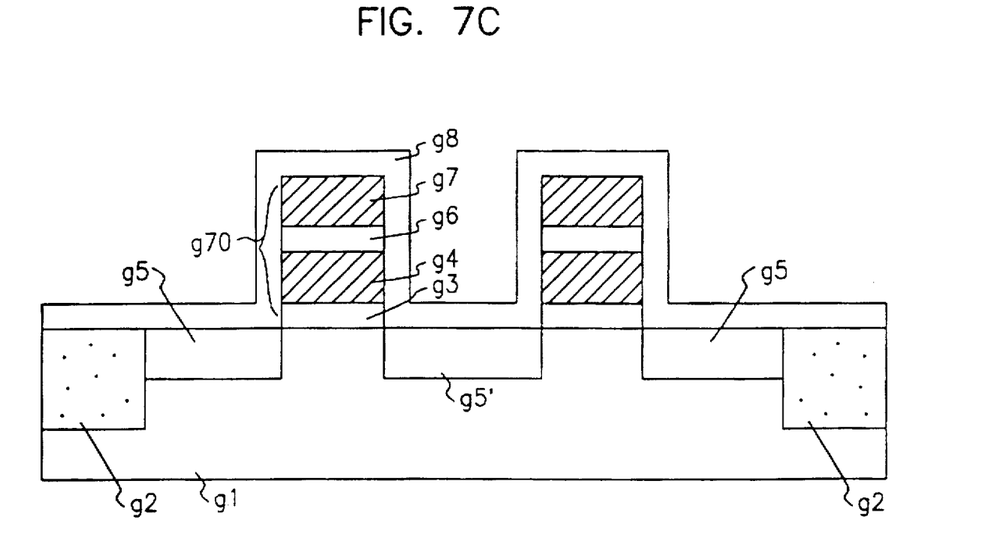

As shown in FIG. 7C, the conducting layer g7 and the insulation layer g6 are patterned in a predetermined size on the gate oxide layer g3, and the insulation layer g8 is deposited on the resulting structure.

At this time, the gate electrode g4, the insulation layer g6 and the conducting layer g7 can be deposited and patterned in order to form the stacked structure g7.

Figure 7D:
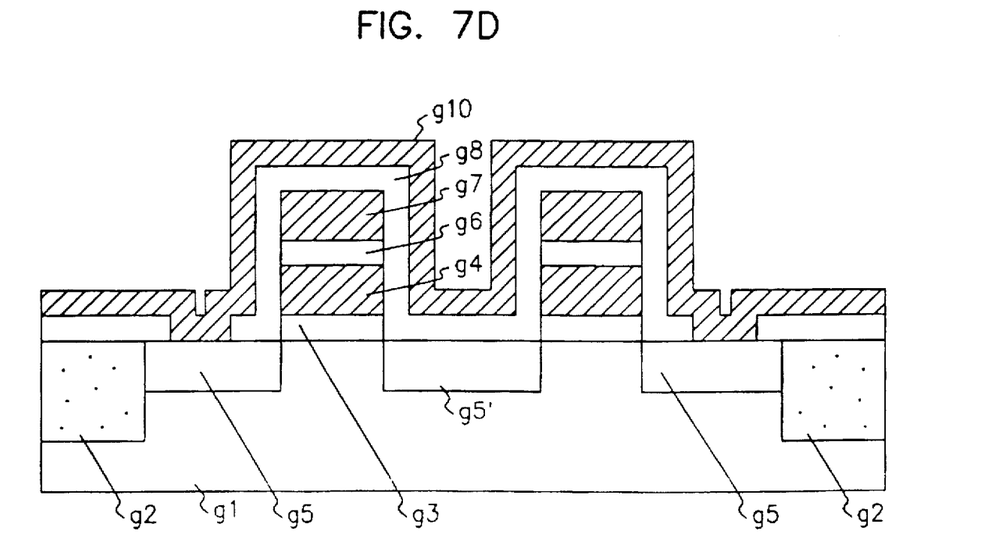

As shown in FIG. 7D, a portion of the source region g5 is exposed by defining the insulation layer g8 in order to electrically connect the source region g5 of the write transistor with a conducting layer, which may be used for a floating gate of the present invention, and the polysilicon layer g10 for the floating gate is deposited on the resulting structure, being electrically connected with the source region f5.

Figure 7E:
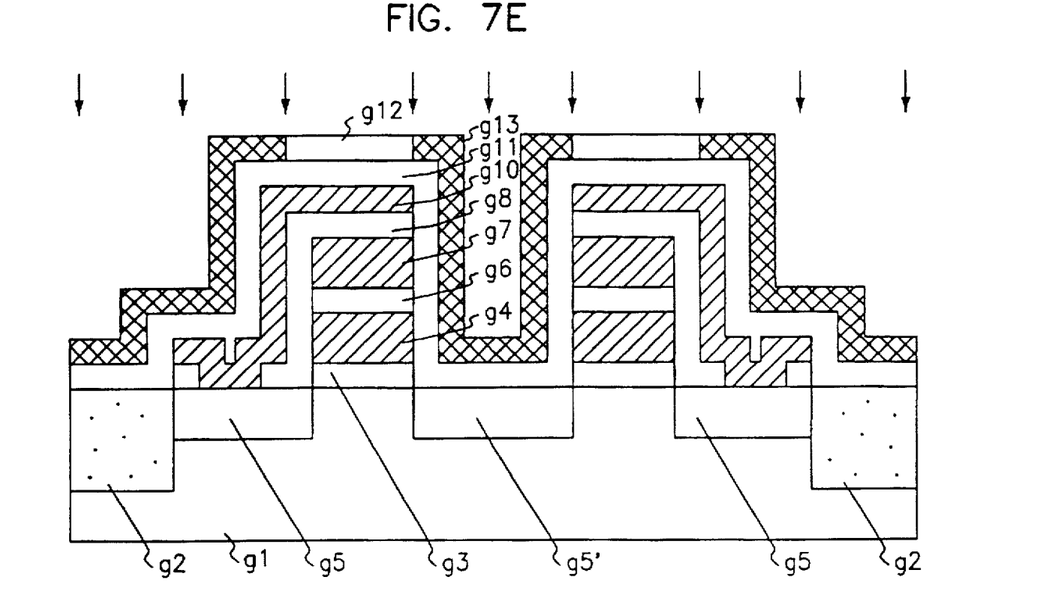

As shown in FIG. 7E, a polysilicon layer g10 is patterned together with the insulation layer g8. At this time, if necessary, the insulation layer g8 may not be patterned. The gate oxide layer g11 of the read transistor and a silicon layer g12 are, in order, deposited on the resulting structure to form a thin film transistor(N-channel). Also, the ion implantation is performed to adjust the threshold voltage of the read transistor by implanting ions into the channel region of the silicon layer g12, and the highly doped source and drain regions g13 are formed by implanting ions into the silicon layer g12 outside the channel region.

Figure 7F:
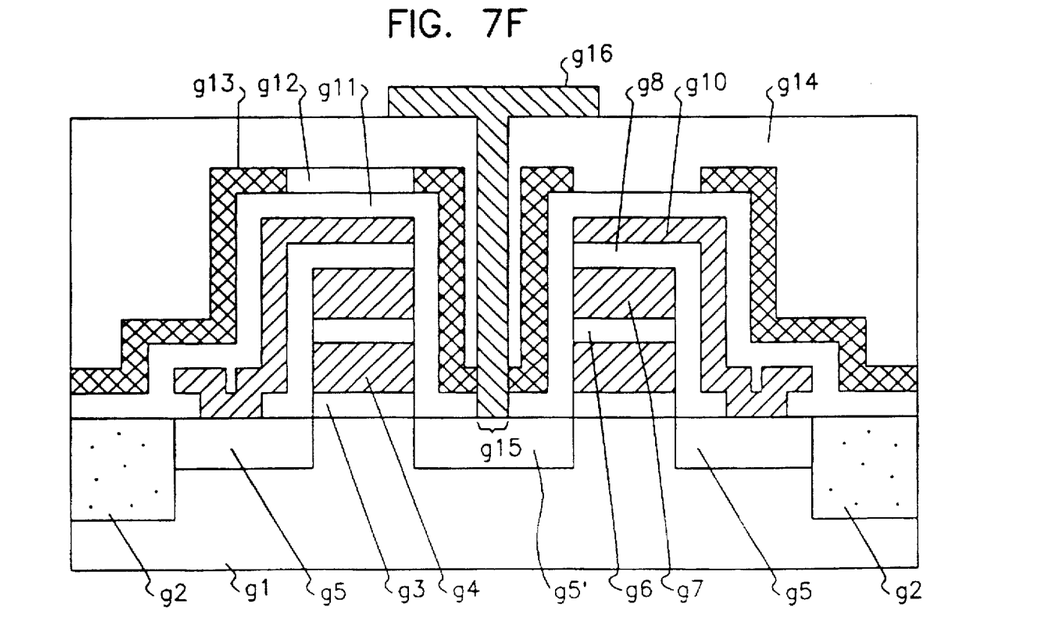

As shown in FIG. 7F, a insulation layer g14 is deposited with the planarization process on the resulting structure, and the portions of the insulation layer g14, the drain region of the read transistor and the insulation layer g11 are, in order, etched such that the drain region g5' is exposed. Accordingly, the sidewall of the drain region g13 of the read transistor and the drain region g5' of the write transistor are exposed in a contact hole g15, and a conducting layer g16 for a bit line is filled in the contact hole g15, being connected with the drains g13 and f5'.

As illustrated above, the DRAM cell in accordance with another embodiment of the present invention is composed of a top gate transistor (write transistor) and a bottom gate transistor (read transistor) having each gate electrode. The floating gate electrode of the read transistor is electrically connected with the source region of the write transistor. Furthermore, the channel region and the floating gate of the read transistor is positioned over the gate electrode of the write transistor.

Figure 8:
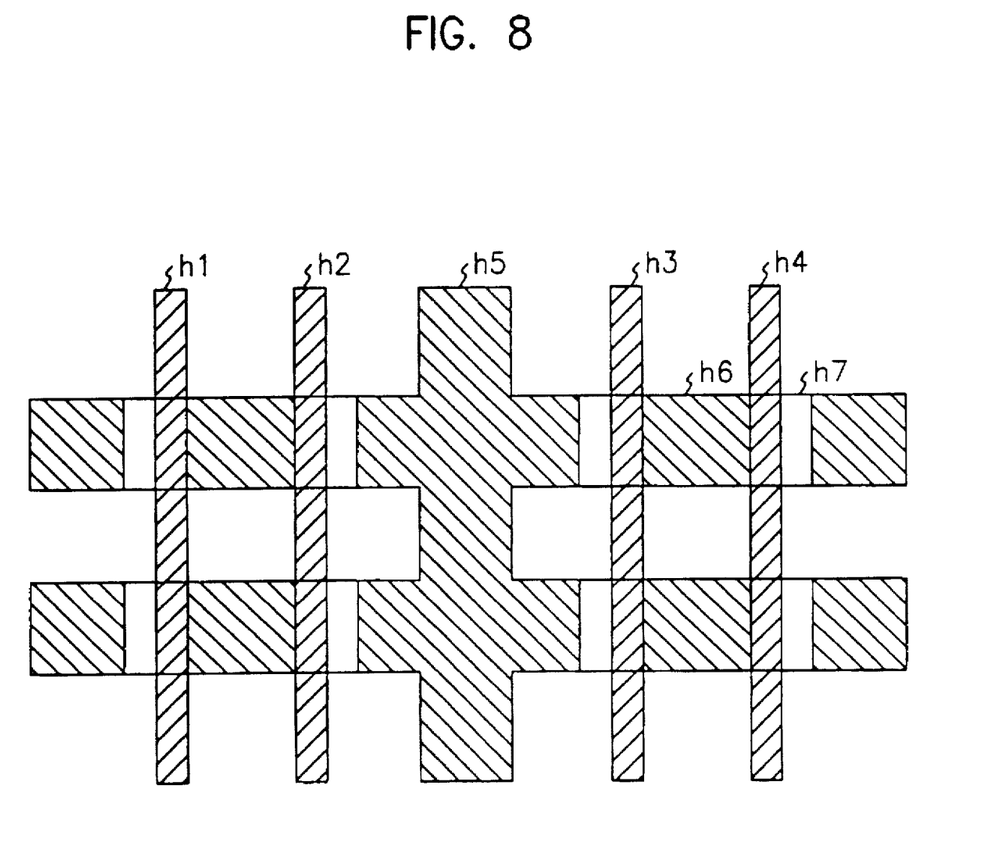
FIG. 8 is a lay-out of the reference voltage terminal for reading data stored in the memory cell of the present invention.

FIG. 8 is a lay-out of the reference voltage terminal for reading data stored in the memory cell of the present invention. In FIG. 8, the reference numeral h1, h2, h3 and h4 denote a read transistors (read word line), h5 denotes a reference voltage terminal for reading data, h6 denotes a drain of the read transistor, h7 denotes a polysilicon layer. As shown in FIG. 8, the source of the read transistor, which is used as the reference voltage terminal, is positioned between the read transistors h2 and h3. Also, the reference voltage terminal is made of n+ or p+ doped polysilicon layer.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A DRAM cell comprising:
    an input/output bit line;
    a first word line being activated by a write control signal;
    a second word line being activated by a read control signal;
    a first transistor having a first terminal coupled to said input/output bit line and a second terminal, and having a gate electrode coupled to said first word line for coupling said first terminal to said second terminal responsive to said write control signal;
    a second transistor having a gate electrode coupled to said second word line, a first terminal coupled to a reference voltage terminal, a second terminal coupled to said input/output bit line, and having a floating gate electrode coupled to said second terminal of said first transistor for coupling said first terminal to said second terminal responsive to said read control signal, wherein the voltage level of said input/output bit line is transferred to said floating gate; and
    a capacitor between said second terminal of said first transistor and said floating gate of said second transistor,
    wherein said first transistor varies the threshold voltage of said second transistor at a write operation and is turned off at a read operation, and said second transistor transfers the voltage level of said reference voltage terminal to said input/output bit line at said read operation and is turned off at said write operation.

2. A DRAM cell in accordance with claim 1, wherein said input/output bit line is connected with another neighboring DRAM cell.

3. A DRAM cell in accordance with claim 1, wherein said threshold voltage of said second transistor is approximately 3.0V when said first transistor is turned off, and is approximately 1.0V when said first transistor is turned on.

4. A DRAM cell in accordance with claim 3, wherein 2.0V is applied to said second word line to activate said second transistor at a read operation.

5. A DRAM cell comprising:
    an input/output bit line;
    a word line which a positive or a negative voltage applied to;
    a first transistor having a first terminal coupled to said input/output bit line, a second terminal, and having a common gate electrode coupled to said word line for coupling said first terminal to said second terminal when said positive voltage is applied to said word line;
    a second transistor having a first terminal coupled to a reference voltage terminal, a second terminal coupled to said input/output bit line, and having a floating gate electrode coupled to said second terminal of said first transistor for coupling said first terminal to said second terminal when said negative voltage is applied to said word line; and
    a capacitor between said second terminal of said first transistor and said floating gate of said second transistor,
    wherein the voltage level of said input/output bit line is transferred to said floating gate,
    wherein said second transistor is turned on by said common gate electrode with said word line, and
    wherein said first transistor varies the threshold voltage of said second transistor at a write operation and is turned off at a read operation, and said second transistor transfers the voltage level of said reference voltage terminal to said input/output bit line at said read operation and is turned off at said write operation.

6. A DRAM cell in accordance with claim 5, wherein said input/output bit line is connected with another neighboring DRAM cell.

7. A DRAM cell in accordance with claim 5, wherein said first and second transistors are turned off when 0 V is applied to the said word line.

8. A DRAM cell in accordance with claim 5, wherein said positive voltage is 2.5 V.

9. A DRAM cell in accordance with claim 5, wherein said negative voltage is −2.5 V.

10. A DRAM cell in accordance with claim 5, wherein said first transistor is an NMOS transistor and said second transistor is a PMOS transistor.

11. A DRAM cell in accordance with claim 9, wherein said PMOS transistor is a thin film transistor.

12. A DRAM cell comprising:
    an input/output bit line;
    a word line which a positive or negative voltage is applied to;
    a first transistor having a first terminal coupled to said input/output bit line, a second terminal, and having a gate electrode coupled to said word line for coupling said first terminal to said second terminal when said positive voltage is applied to said word line;

a second transistor having a first terminal coupled to a reference voltage terminal, a second terminal coupled to said input/output bit line, and having a gate electrode coupled to said word line and a floating gate electrode coupled to said second terminal of said first transistor for coupling said first terminal to said second terminal when said negative voltage is applied to said word line, wherein the voltage level of said input/output bit line is transferred to said floating gate; and a capacitor between said second terminal of said first transistor and said floating gate of said second transistor, wherein said first transistor varies the threshold voltage of said second transistor at a write operation and is turned off at a read operation, and said second transistor transfers the voltage level of said reference voltage terminal to said input/output bit line at said read operation and is turned off at said write operation.

13. A DRAM cell in accordance with claim 12, wherein said input/output bit line is connected with another neighboring DRAM cell.

14. A DRAM cell in accordance with claim 12, wherein said first and second transistors are turned off when 0 V is applied to the said word line.

15. A DRAM cell in accordance with claim 12, wherein said positive voltage is 2.5 V.

16. A DRAM cell in accordance with claim 12, wherein said negative voltage is −2.5 V.

17. A DRAM cell in accordance with claim 12, wherein said first transistor is an NMOS transistor and said second transistor is a PMOS transistor.

18. A DRAM cell in accordance with claim 17, wherein said PMOS transistor is a thin film transistor.

* * * * *